United States Patent [19]

Chason et al.

[11] Patent Number: 4,948,030

[45] Date of Patent: Aug. 14, 1990

[54] BOND CONNECTION FOR COMPONENTS

[75] Inventors: Marc K. Chason, Schaumburg; Michael J. Onystok, Bloomingdale; Nathan P. Bellin, Chicago, all of Ill.

[73] Assignee: Motorola, Inc., Schaumburg, Ill.

[21] Appl. No.: 304,052

[22] Filed: Jan. 30, 1989

[51] Int. Cl.$^5$ .......................... B23K 1/20; H05K 3/34
[52] U.S. Cl. .................... 228/118; 228/179; 228/180.2; 228/203
[58] Field of Search ............... 228/173.5, 179, 180.2, 228/234, 238, 242, 4.5, 118, 215, 203, 15.1, 904, 254

[56] References Cited

U.S. PATENT DOCUMENTS

| | | | |
|---|---|---|---|
| 3,116,992 | 1/1964 | Greiner et al. | 228/179 |
| 3,249,910 | 5/1966 | Venn et al. | 228/118 |
| 3,307,246 | 3/1967 | Gulliksen et al. | 228/179 |
| 3,451,122 | 6/1969 | Kuhns et al. | 228/173.5 |
| 3,599,326 | 8/1971 | Di Renzo | 228/118 |
| 3,672,047 | 6/1972 | Sakamoto et al. | 228/254 |
| 3,717,742 | 2/1973 | Fottler | 228/180.2 |
| 3,718,968 | 3/1973 | Sims | 228/242 |
| 3,889,364 | 6/1975 | Krueger | 228/179 |
| 4,337,573 | 7/1982 | Nicolas et al. | 228/179 |
| 4,442,967 | 4/1984 | Van de Pas et al. | 228/179 |
| 4,534,811 | 8/1985 | Ainslie et al. | 228/242 |
| 4,536,786 | 8/1985 | Hayakawa et al. | 228/180.2 |
| 4,705,204 | 11/1987 | Hirota et al. | 228/179 |
| 4,717,066 | 1/1988 | Goldenberg et al. | 228/45 |
| 4,907,734 | 3/1990 | Conru et al. | 228/110 |

FOREIGN PATENT DOCUMENTS

| | | | |
|---|---|---|---|
| 61-214530 | 9/1986 | Japan | 228/4.5 |
| 62-16537 | 1/1987 | Japan | 228/4.5 |
| 3642221 | 6/1987 | Japan | 228/179 |
| 2151529 | 7/1985 | United Kingdom | 228/179 |

Primary Examiner—Sam Heinrich
Attorney, Agent, or Firm—Joseph P. Krause

[57] ABSTRACT

An electrical joint using spheroidal tipped leads improves the strength of a connection regardless of the material used to bond the connections. Axial leads of a component are formed into spheroids using an appropriate heat source to melt a small portion of the lead tip. Melting a portion of the lead alloys the lead with any non-wettable solder mask rendering a wettable spheroid. Surface tension in the molten metal forms the spheroid. The spheroid increases the area to which solder or other bonding agent adheres to. Solder mask remaining on the lead decreases solder wicking further up the lead. Reduced solder wicking retains the compliance of the lead. Controlled melting of the lead maintains planarity for multileaded components.

1 Claim, 1 Drawing Sheet

BOND CONNECTION FOR COMPONENTS

BACKGROUND OF THE INVENTION

This invention relates to bonded electrical connections for electrical components. Specifically, this invention is an improved connection for small components having metallic electrodes or wires by which they are connected to circuit boards or other conductors.

Connecting an electronic device to a circuit board or substrate is usually accomplished by soldering, a process wherein an electronic device having a metal wire lead attached to it is heated together with a circuit board or substrate and to both of which is applied molten solder, typically a mixture of tin and lead. The molten metal solidifies around the circuit board and lead, electrically and mechanically bonding the circuit board and lead together.

Other methods of connecting components together use electrically conductive adhesives which are useable over a range of temperatures. Some of these adhesives include electrically conductive organic based adhesives and inorganic based adhesives.

A principle objective in connecting electronic devices together is the maintenance of the electrical connection despite mechanical stresses imposed on the joint. The mechanical strength of an electrical connection is dependent upon not only the type of bonding agent used to join the conductors but also upon the geometry of the conductors being joined.

A simple butt joint, which is a joint comprised of a wire held nearly perpendicular to a flat circuit board, holds the wire in place principally by virtue of shear forces in the bonding agent. It is well known that solder joints and adhesive joints that rely on shear strength alone are the weakest type of joints. To improve the strength of connections made with solder or adhesives, different lead geometries which offer the ability to resist force in shear, compression, and tension are frequently used.

One lead shape which improves the strength of a joint is a gull-wing lead (so named because of the shape of the lead after it is bent) which increases the area of the lead tangent to the surface of a circuit board, thus increasing resistance to tensile forces. The gull-wing joint requires a longer lead length to permit bending the lead so that the lead is not joined at right angles to the circuit board. The gull-wing also requires a larger footprint on a circuit board because of its shape.

Another lead shape which improves the strength of a joint is a J-lead, so named because the lead of a component is bent under the component to resemble the letter "J". The J-lead, like the gull-wing, requires more lead length, but for a given connection requires less circuit board area than the gull-wing connection. The principle drawbacks of the J-lead are its cost and the difficulty associated with inspecting the completed connection. Since the J-lead is bent under a component, it is difficult to inspect after the soldering process.

The butt joint, gull-wing and J-lead connections also suffer from solder wicking, a phenomenon in which molten solder migrates along the lead. Solder wicking produces localized collection of solder at bends in the leads which reduces the ability of the lead to flex. This reduced compliance of the leads increases failures of solder joints. In addition to solder wicking, gull-wing and J-lead connections are also difficult to manufacture with uniform lengths because of the plastic and elastic deformation of the bent leads. Components using gull-wing and J-lead leads, after bending, are frequently of slightly different heights. The ends of the leads are not coplanar. This lack of coplanarity makes gull-wing and J-leads difficult to use because one slightly longer lead electrically disconnects shorter leads from a circuit board.

An electrical connection useable with solder or adhesives, which is easy to fabricate, minimizes circuit board space usage, improves the strength of a joint over simple butt joints, has coplanar leads and eliminates solder wicking would be an improvement over the prior art.

SUMMARY OF THE INVENTION

This invention improves the strength of bonded electric joints, including soldered and glued joints, by reconfiguring the end of a standard butt lead to a different shape. A portion of a standard butt lead is melted, which due to surface tension forces in the molten metal, produces a spheroidal shape at the tip of the butt lead. After the butt lead tip melts, and after a spheroid is formed, the heat source is removed, thus allowing the molten metal to solidify and retain the spheroidal shape of the end of the lead. Melting similar amounts of material produces similarly sized spheroids.

The spheroidal shape of the end of the lead permits a connection between the spheroid and the circuit board to hold the spheroid in place by means of any combination of shear forces, tensile forces and compressive forces. Unlike a J-lead or a gull-wing lead the spheroidal tip lead minimizes circuit board space usage, is easy to fabricate, and is easy to inspect after the bonding agent is applied to the joint. Local heating of the end of the axial lead can be accomplished using a laser, an ion source, an electron beam, torch, or electric discharge methods, for example.

When using leads that are coated with solder mask material, melting a portion of a lead alloys the solder mask with the lead material, effectively eliminating the mask from the area where solder is to be applied. Solder adheres to the spheroid but is prevented from wicking along the remainder of the lead.

DETAILED DESCRIPTION OF THE PREFERRED EMBODIMENT

Figure 1A:
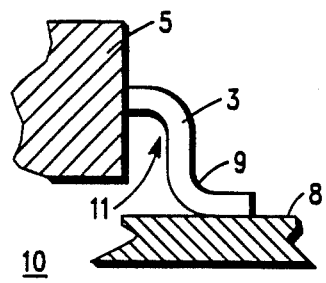
FIGS. 1A, 1B, and 1C show schematic cross-sectional views of prior art solder joints.

Referring to FIG. 1, there is shown three schematic cross-sectional views of prior art lead configurations used in soldering components to circuit boards or substrates. In FIG. 1A, there is shown a gull-wing 10 where an axial lead electrode 3 from a component 5 is bent to permit the lead to contact the circuit board 8 tangentially. By virtue of the curved region 9, the surface area of the axial lead electrode in contact with the circuit board 8 is improved but at the cost of increased circuit board space usage.

Figure 1B:
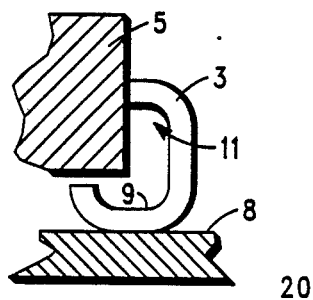

In FIG. 1B, a J-lead configuration 20 is shown where an axial lead electrode 3 is bent under the component 5 to form a figure shaped similarly to the letter J. By virtue of the curved region 9, the surface area of the lead in contact with the circuit board 8 is also improved but at the cost of difficult fabrication of the J-lead configuration and the inability to inspect the connection after the bonding agent is applied.

Figure 1C:
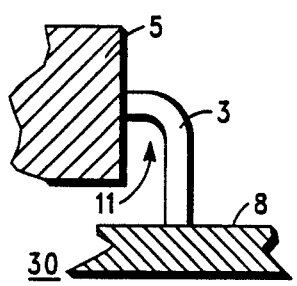

In FIG. 1C, a butt joint 30 is shown wherein the axial lead electrode 3 meets the circuit board 8 substantially perpendicular to the circuit board and to which the bonding agent, either solder or adhesive is applied, holding the butt joint in place. The bonding agent used in any of these configurations is typically a tin-based solder material but may also be any other suitable solder. Referring to FIGS. 1A, 1B and 1C, if solder is allowed to accumulate in region 11, then joint compliance is reduced. The stiffened lead will result in premature joint failure.

Figure 2A:
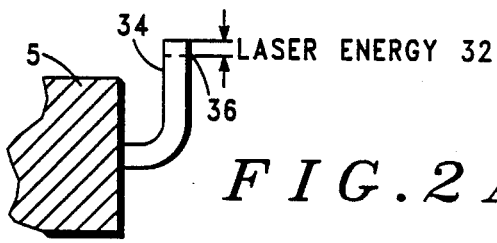
FIGS. 2A and 2B show a cross-sectional schematic of a laser beam incident on the end of a butt lead.
Figure 2B:
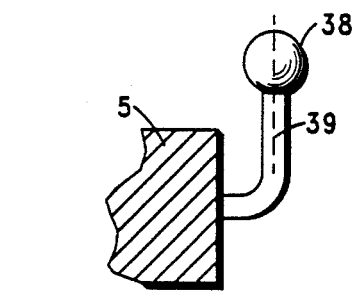

Referring now to FIG. 2, there is shown a simple butt lead electrode 34 from an electronic component in FIG. 2A to which is applied a beam of laser energy 32 which impinges upon the butt lead 34 in the region denoted by the numeral 36. Application of the laser energy beam 32 locally melts the axial lead 34 and by virtue of surface tension existing in the molten metal causes the formation of a spheroid 38 as indicated in FIG. 2B. Removal of the laser energy permits the spheroid to solidify.

A spheroid-tipped lead increases the surface area to which a bonding agent, such as solder, can act upon. Forming a spheroid by melting leads permits the overall length of the lead to be controlled improving the coplanarity of multiple lead ends in a multi-leaded device. The spheroid also permits the bonding agent to bond in tension, compression and shear.

Note that the spheroid 38, while not a sphere has a "center" when it forms which is approximately coaxial with the center axis 39 of the lead 34. Changing the orientation of the lead during formation or solidification of the spheroid would change the position of attachment of the spheroid to the lead as it solidifies albeit at the expense of strength of the lead. As the spheroid moves away from the center of the lead, the strength of the lead can decrease. The preferred attachment point of the spheroid is with the center of the spheroid coaxial with the axis of the lead 34.

After the spheroid solidifies, it may be attached to a second conductor or another electrode by soldering or other techniques, such as conductive adhesive bonding. The second conductor to which the spheroid is attached is typically a planar circuit board but could also be another wire, or, another spheroid for instance.

Another benefit of melting the axial lead 34 to form a spheroid is that any non-wettable solder mask applied to the axial lead 34, required to reduce wicking, becomes mixed with the molten metal of the lead 34. Mixing the solder mask and molten lead effectively alloys the non-wettable solder mask with the molten lead thereby permitting adhesion of solder to the solidified spheroid itself but to no where else along the length of lead 34 where solder mask material remains. Melting a portion of the lead 34 effectively removes solder mask only from the melted region of the lead 34 to which solder will be applied.

Solder mask materials of the proper thickness, either metallic, organic, or inorganic can be freely applied to the component and leads without regard to the disposition of the solder mask prior to the soldering process. Some of these solder mask materials include nickel-based and copper-based materials.

Figure 3:
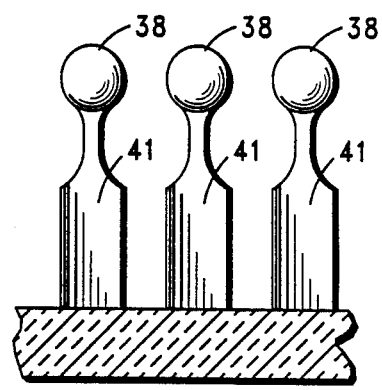
FIG. 3 shows a drawing of an axial lead after being locally heated with a laser beam and forming a spheroid at the end.

Referring to FIG. 3, there is shown a drawing of an axial lead set 41 that is subjected to energy to form spheroids 38 at the end of the lead tips. Note that virtually none of these spheroids formed at the lead tips are exact or perfect spheres; rather, some distortion in the shape of the spheres exists. Spheroid shape is substantially consistent, however, and reproducible. When heating the leads, the location of the spheroids with respect to each other, and hence the overall length of the lead, can be controlled by controlling the heat applied to the lead. By appropriately heating leads, their length can be kept uniform and the spheroids kept substantially coplanar. When soldering a multi-leaded component, having all spheroids coplanar decreases the likelihood that one or more leads will be longer than the others and thereby prevent a bond from forming between the shorter leads and a circuit board.

Those skilled in the art will recognize that alternate forms of energy other than laser sources could be used to locally heat the leads. Negative or positive ion sources, electron beams, electric discharge or combustion methods could similarly be used to locally heat the ends of the leads as required.

Figure 4A:
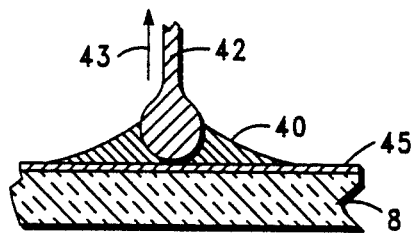
FIGS. 4A and 4B show a cross-sectional side view of a joint between a component and a circuit board and the failure mode of the connection.

Referring now to FIG. 4, there is shown a cross-sectional diagram of the failure mode of a joint formed using the invention. FIG. 4A, shows a spheroidal tipped lead 42 in contact with a planar copper foil 45 on a circuit board 8 and held in place by virtue of the solder joint 40. The spheroidal tipped lead 42 contacts the circuit board 8 substantially tangent to the board. Note that when using electrically conductive bonding agents, the spheroidal tipped lead 42 need not necessarily contact the circuit board 8. The solder joint 40 is typically a tin-based material that is melted and flows around the lead tip. Other bonding agents useable for this joint 40 would include electrically and thermally conductive organic and inorganic adhesives for example.

Figure 4B:
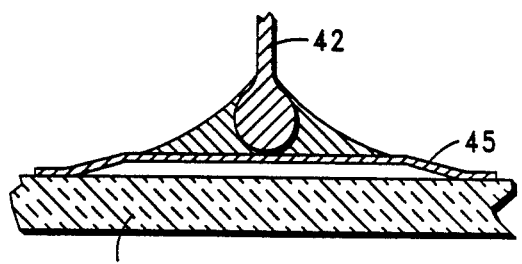

In FIG. 4A, the spheroidal tipped lead 42 was subject to tensile loading axial in the direction shown by arrow 43 until the lead wire failed. In FIG. 4B it is seen that the copper foil 45 attached to the circuit board 8 pulls away from the circuit board 8 before the spheroidal tipped lead 42 separates from the soldered interface 40.

In experiments shown in FIG. 4 the wires used were 0.016 inch outside diameter copper wires. The spheroids were formed using a torch. The samples were soldered to G10 printed circuit boards onto which there was deposited a planar copper circuit board foil. The leads were attached to the copper foil using Kester TM 44 (60Sn/40Pb) resin core solder with a soldering iron.

Experiments were also performed using nickel coated copper wires. A solder wettable spheroid of copper and nickel was formed by heating the lead with a torch. A spheroid formed from the molten lead tip was soldered in place after the spheroid solidified. The nickel coating, which acted as a solder mask, did not inhibit the adhesion of solder to the spheroid but did act to inhibit solder wicking further up the lead. Other solder masks would be organic-based materials, inorganic based materials as well as copper-based and other metallic solder resists.

What is claimed is:

1. A method of attaching a first electrical conductor having a non-wettable solder resist on a surface thereof, to a surface of a second substantially planar electrical conductor, said method comprised of the steps of:

at least partially melting said first conductor and said non-wettable solder resist together in a predetermined area forming a molten spheroid on said first conductor;

solidifying said first conductor and said non-wettable solder resist forming a solid wettable spheroid; and applying a bonding agent to said solid wettable spheroid and to the surface of said second substantially planar electrical conductor.

* * * * *